United States Patent [19]
Frijlink

[11] Patent Number: 5,108,540
[45] Date of Patent: Apr. 28, 1992

[54] METHOD FOR EPITAXIAL GROWTH FROM THE VAPOR PHASE OF SEMICONDUCTOR MATERIALS

[75] Inventor: Peter M. Frijlink, Crosne, France

[73] Assignee: U.S. Philips Corporation, New York, N.Y.

[21] Appl. No.: 283,048

[22] Filed: Dec. 6, 1988

Related U.S. Application Data

[63] Continuation of Ser. No. 943,537, Dec. 16, 1986, abandoned.

[30] Foreign Application Priority Data

Dec. 17, 1985 [FR] France ............................ 85 18677

[51] Int. Cl.⁵ .................................................. C30B 23/06
[52] U.S. Cl. ......................................... 156/612; 156/610; 156/613; 156/614; 118/724
[58] Field of Search ............... 156/610, 612, 613, 614; 118/724

[56] References Cited

U.S. PATENT DOCUMENTS

| | | | |
|---|---|---|---|
| 3,391,017 | 7/1968 | Bolger et al. | 156/614 |
| 3,929,556 | 12/1975 | Pandey | 156/614 |
| 4,518,455 | 5/1985 | Muething | 156/613 |

OTHER PUBLICATIONS

Okamoto et al., "Extremely Uniform Growth of GaAs and GaAlAs by Low Pressure Metalorganic Chemical Vapor Deposition on Three-Inch GaAs Substrates", J. Crys. Growth 70 (1984) 140-144.

Eversteyn et al., "A Stagnant Layer Model . . .", J. Electrochem. Soc., vol. 117, No. 7, 1970, pp. 925-931.

Fujii et al., "A Quantitive Calculation . . .", J. Electrochem. Soc., vol. 119, No. 8, 1972, pp. 1106-1113.

Berkman et al., "Heteroepitaxial Semiconductors for Electronic Devices", Editors: Cullen et al., Springer-Verlag, 1978, Chapter 7.

*Primary Examiner*—R. Bruce Breneman
*Attorney, Agent, or Firm*—Norman N. Spain

[57] ABSTRACT

A method for carrying out epitaxial growth from the vapor phase of layers of semiconductor materials on semiconductor substrates, in a chamber being mainly constituted by a tube containing a susceptor for the substrate, in which tube gaseous components are circulated from one end to the other at a pressure and a temperature suitable to obtain the epitaxial growth of the monocrystalline layers on the substrate. The temperature of the wall of the chamber opposite to the susceptor, this wall being designated as the ceiling of the chamber is regulated, to produce variations of the deposition profile of the epitaxial layer formed on the substrate.

Application: manufacture of discrete components of III-V semiconductor materials.

8 Claims, 4 Drawing Sheets

METHOD FOR EPITAXIAL GROWTH FROM THE VAPOR PHASE OF SEMICONDUCTOR MATERIALS

This is a continuation of application Ser. No. 943,537, filed Dec. 16, 1986, now abandoned.

BACKGROUND OF THE INVENTION

The invention relates to a method for carrying out epitaxial growth from the vapor phase of layers of semiconductor materials on semiconductor substrates, in a chamber being mainly constituted by a tube containing a susceptor for the substrate, in which tube gaseous compounds are circulated from one end to the other at a pressure and a temperature suitable to obtain the epitaxial growth of monocrystalline layers on the substrate.

The method is used in the manufacture of discrete components, such as: semiconductor lasers, photodiodes, photocathodes, field effect transistors, bipolar heterojunction transistors and in the formation of integrated circuits joining together one or several types of these components.

The manufacture of epitaxial layers from the vapor phase of materials of the group III-V is described in the magazine ACTA ELECTRONICA Feb. 21, 1978. The article of L. Hollan entitled "La croissance épitaxiale de GaAs en phase vapeur", p. 117–127, and the article of J. P. Hallais entitled "Croissance épitaxiale de semiconducteurs III-V a partir de composés organométalliques et d'hydrures", p.129–138, give information in the first place about the formation of epitaxial layers on substrates of GaAs from the vapor phase of chlorides and in the second place about the formation of such layers from the vapour phase of organometallic compounds. Other articles in the same magazine describe the use, of indium phosphide and gallium nitride.

The methods generally used have in common the introduction into a reactor of gaseous compounds from which the growth from the vapour phase takes place. This reactor generally has the form of a tube of quartz. The substrates are disposed in the tube on a sample carrier or a susceptor. The monocryatalline layers grow on the substrates upon the passage of the gaseous compounds. The aforementioned prior art documents state (p.132) that the rate of deposition essentially depends upon the composition of the flow of gas, but does not depend upon the deposition temperature. It should be noted (p.130) that in the method using organometallic compounds, reactors having cold walls are recommended.

In the field of semiconductor devices manufactured from compounds of the III-V group, the quality of the epitaxial layers is of major importance for obtaining a high manufacturing efficiency.

Since the semiconductor devices manufactured from materials of the III-V group are assumed to become of increasing interest in the future, attempts are made to improve the quality of the layers, of which these devices are made, in order to facilitate the manufacture of the devices.

These layers produced according to the technique of the prior art are generally not of uniform thickness. It has been found that the layers obtained by epitaxy from the vapor phase are thicker on the side on which the flow of gas enters into the reactor chamber than on the side on which it leaves this chamber. Moreover, it has been found that the rate of growth not only is not constant along the whole axis of the sample but that also the reduction of this rate is not linear. The curve of the rate of growth drawn as a function of the distance measured along the axis of the sample parallel to the flow of gases is a falling curve whose slope falls uniformly.

SUMMARY OF THE INVENTION

Therefore, the present invention provides a method which permits of improving the uniformity of the epitaxial layers obtained from the vapor phase and hence the quality of the semiconductor devices obtained by means of these layers.

According to the present invention, this object is achieved by means of a method of the kind described in the opening paragraph, characterized in that the temperature of the wall of the chamber opposite to the susceptor, the so-called ceiling of the chamber, is regulated in order to produce variations of the profile of deposition of the epitaxial layer obtained on the substrate.

In a certain case, this method can be characterized in that the temperature of the ceiling is regulated so as to obtain a linear uniform decrease of the rate of growth of the layers parallel to the so-called longitudinal direction of the circulation of the flow of gas when the sample is immovable.

In another case, this method can be characterized in that the temperature of the ceiling is regulated so as to obtain for the epitaxial layer when the sample is immovable a profile of deposition according to an anti-symmetrical function with respect to a point of the sample taken as the origin.

In another case, this method is characterized in that the temperature of the ceiling is regulated so as to obtain for the epitaxial layer when the sample is immovable a profile of deposition which is convex in the direction at right angles to the flow of gas.

Moreover, this method is characterized in that the sample is subjected to a rotation with respect to an axis at right angles to its plane arranged at the center of anti-symmetry of the profile obtained in the absence of a rotation. Thus uniformity of deposition is obtained.

Consequently, according to the invention, the regulation of the temperature of the ceiling produces an effect on the profile of the deposition of the epitaxial layer in contrast with the experiments which had been carried out according to the prior art and which showed that the rate of growth does not depend upon the temperature of deposition and that on the other hand in one of the two preferred methods (using organo-metallic compounds) it was to be preferred to avoid the heating of the walls of the reactor. Thus, according to the invention, layers either homogeneous or of constant thickness can be obtained.

DETAILED DESCRIPTION OF THE INVENTION

In order that the invention may be readily carried out it will be described in greater detail with reference to the figures of the accompanying drawing.

Figure 1:
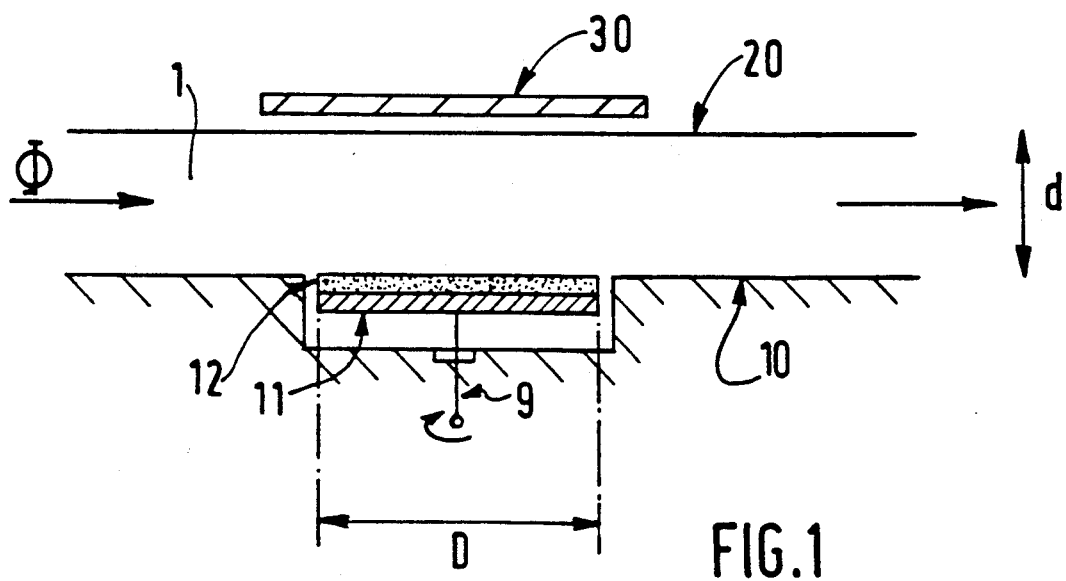
FIG. 1 shows a cross-sectional view of the deposition chamber of a reactor for forming epitaxy layers from the vapor phase.

As shown in FIG. 1, the deposition chamber 1 of a reactor for processing epitaxial layers is essentially formed by a part of a tube of quartz and may be of rectangular cross-section.

At the level of the lower wall 10 of the chamber, there is arranged a sample carrier, designated as susceptor 11, of the substrate 12. The upper wall at the ceiling 20 of the chamber is arranged very close to the sample. The distance measured between the surface of the sample and the ceiling is d.

The flow $\phi$ of the gaseous components required for the epitaxial growth is parallel to the surface of the sample. The inlet and the outlet of the gases are situated on either side of the sample. The distance measured along the sample according to the direction of the flow $\phi$ is D.

In the embodiment shown here of the manufacture of epitaxial layers on a monocrystalline solid substrate 12 of gallium arsenide (GaAs) or of indium phosphide (InP) the flow $\phi$ of the gaseous components is constituted for the major part by hydrogen ($H_2$), which is mixed with arsine ($AsH_3$) and/or phosphine ($PH_3$) and/or an organometallic compound of an element of group III.

In the manufacture of III-V epitaxial layer it should be noted that while the elements of group V are readily obtained in volatile form, the elements of group III, which do not exhibit a vapor tension usable for the transport at the temperature of growth, have to be introduced, for example, in the form of chlorides or in the form of an organometallic compound. The hydrogen gas is used as vector gas. The temperature of growth of the epitaxial layers formed from these starting elements lies between 500° and 850° C.

The sample carrier, for example of graphite, provided with a substrate, for example of gallium arsenide (GaAs), is brought to a temperature in the range of the aforementioned temperatures and this temperature is controlled, for example, by a thermocouple.

The publications mentioned as prior art of the invention state that the rate of growth does not depend upon the epitaxy temperature in the range of 500° to 850° C.

Figure 2:
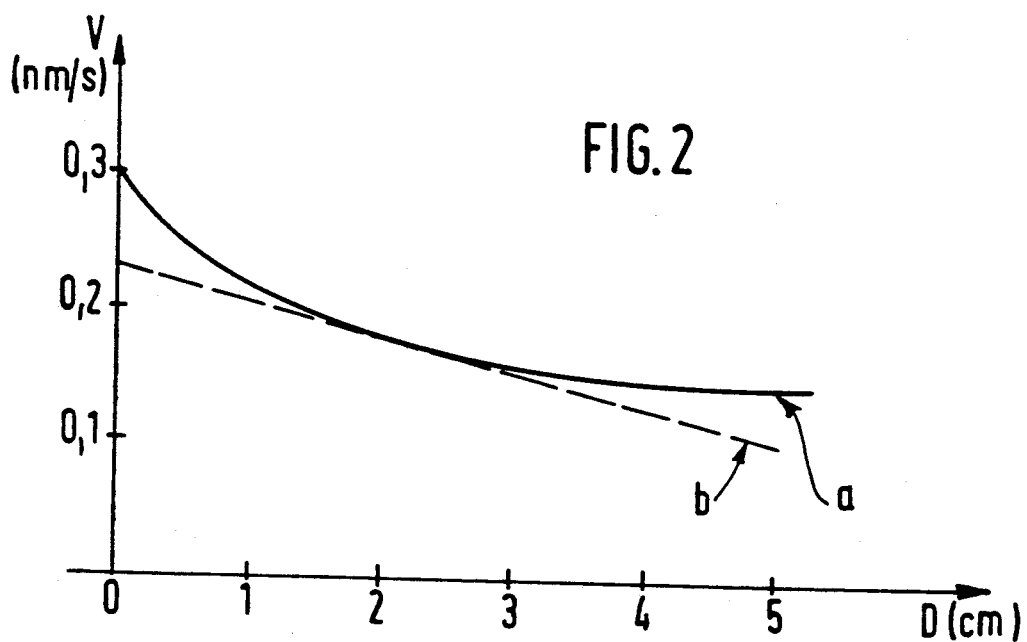
FIG. 2 shows the curve of the rate of epitaxial deposition on a substrate as a function of the distance measured along the sample parallel to the flow of gases:
(a) in full lines when the chamber is not provided with a device for controlling the temperature according to the invention (b) in broken lines when the chamber is provided with a device for controlling the temperature according to the invention.

However, it has been found, as shown on the curve in full lines (a) of FIG. 2, that the rate of growth V (in nm/S) given as a function of the distance D (in cm) measured along the axis of a sample parallel to the direction of the flow of the gaseous components, is not constant.

This curve shows that the rate of growth is very high on the side on which the gaseous components are introduced and that it decreases first very rapidly and then more slowly on the side of the sample facing the outlet of the flow of gas.

Consequently, not only the rate of growth decreases from the inlet to the outlet of the flow of gas, but also this decrease is not linear, the curve a) showing a slope which is also falling as a function of the distance measured along D.

According to the invention, a device 30 for controlling the temperature of the wall 20 opposite to the sample susceptor is arranged at the ceiling of the chamber.

This device is advantageously constituted by a device for heating the ceiling of the deposition chamber, which device can be formed by means of heating resistors. According to the invention, the ceiling of the chamber is not heated uniformly. The temperature of the ceiling of the chamber is controlled by regulating this heating device so as to obtain, a non-uniform distribution of the temperature.

When the regulation of the device for heating the ceiling of the chamber is caused to vary and hence a non-uniform distribution of the temperature of this ceiling is provided for in a controlled manner, the object aimed at is achieved, i.e. a linear uniform decrease of the rate of growth of the layers in the direction of circulation of the flow of gas. Consequently, the curve (b) of FIG. 2 indicated with broken lines is obtained, i.e. in the same conditions of temperature of the susceptor and of pressure of the gases.

Figure 3:
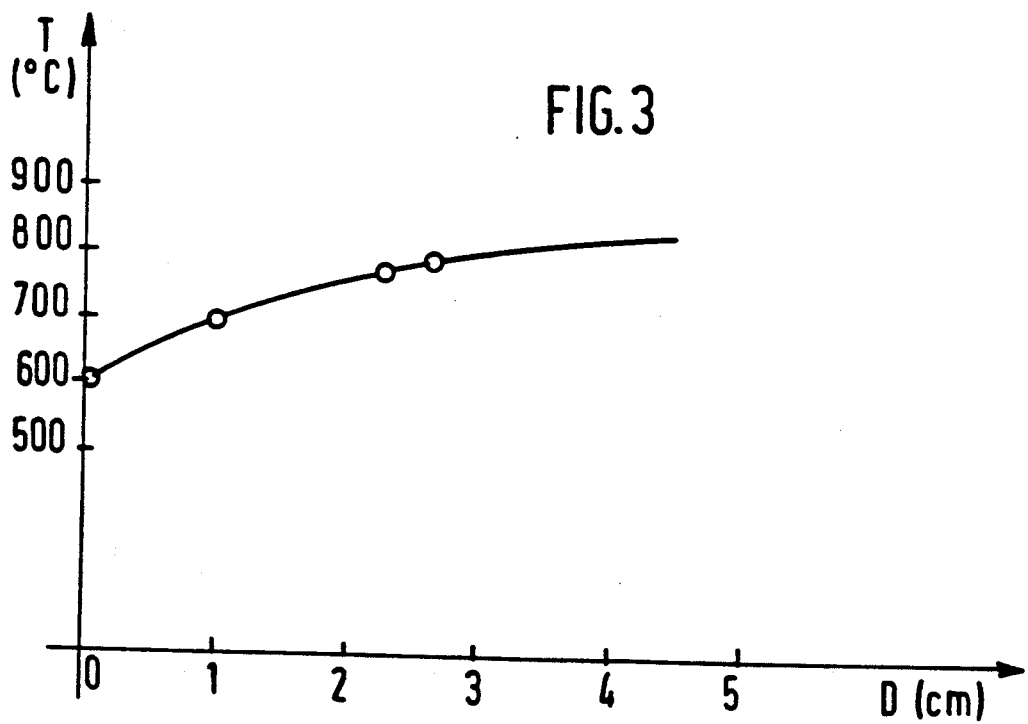
FIG. 3 shows a curve of variation of the temperature of the ceiling as a function of the distance measured parallel to the direction of the flow of gases in a chamber provided with the control device according to the invention.

FIG. 3 shows a curve of the controlled temperature T of the ceiling of the chamber, which is particularly favorable for obtaining the linearly falling curve (b) of FIG. 2 falling linearly. This curve of FIG. 3 is roughly rising as a function of the distance D measured along the axis of the sample in the direction of the flow. Advantageously, it has even a falling slope as a function of the distance measured along D.

It is evident that the formation of an ideal profile of the curve of the temperature of the ceiling indicated in FIG. 3 is eminently a function:
  of the temperature of growth
  of the temperature of the susceptor,
  of the overall pressure of the gases,
  of the partial pressures of the gases,
  of the type of material to be deposited,
  of the dimension of the deposition chamber.

These parameters, which are numerous, render it necessary to provide for a stepped operation of the device for controlling the regulated temperature of the ceiling of the chamber or to utilize a small ordinate program for the regulation of the heating of the ceiling of the chamber.

Such techniques are well known to those skilled in the art and do not require any operations other than the step-by-step or programmed operation until the linearly falling curve (b) of FIG. 2 is obtained.

Figure 4A:
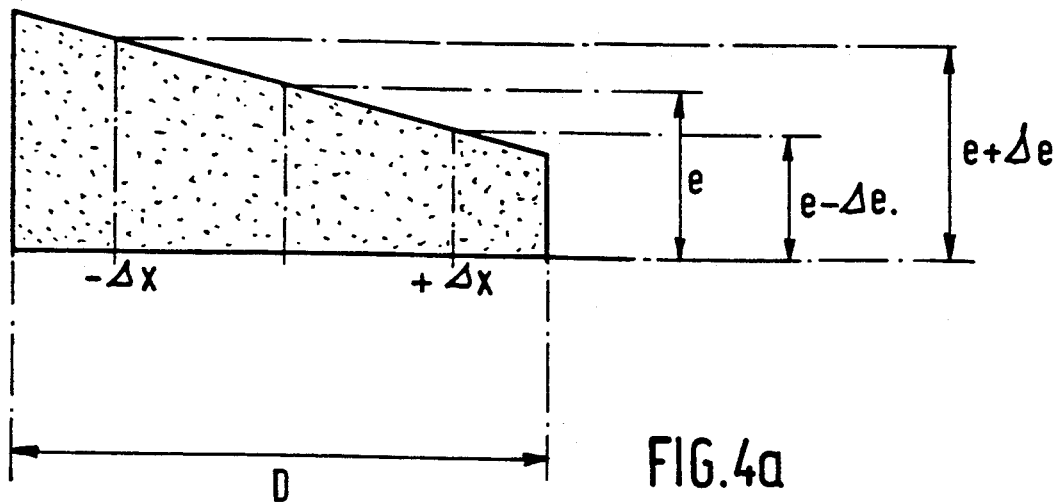
FIGS. 4a–4b show the relation between the linearity of the rate of deposition in the absence of a rotation of the susceptor and of the constant rate of deposition in the presence of the rotation of the susceptor in an epitaxy chamber according to the invention.
Figure 4B:
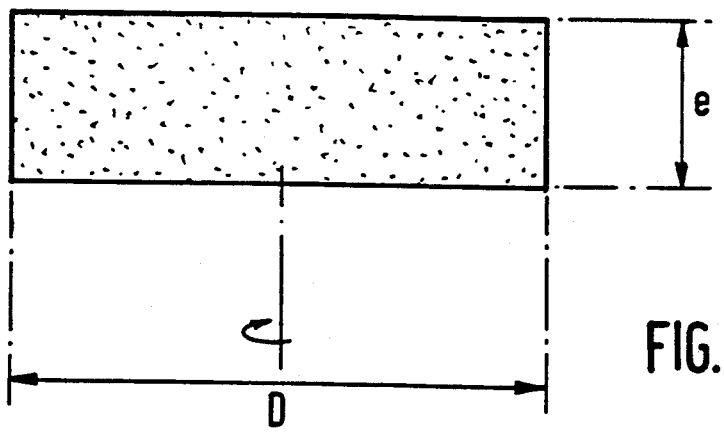

When the linearity of the decrease of the rate of growth is obtained. FIGS. 4a and 4b clearly show how by a simple rotation of the sample, a layer of constant thickness is then grown on the surface of the latter.

In fact, in the absence of a rotation, the sample 12 would receive at its center 0 a layer having a thickness e, while two points of the sample situated at the distance $+\Delta x$ from the point 0 and the distance $-\Delta x$ from the point 0, respectively, would receive a layer having a thickness $e - \Delta e$ and $e + \Delta e$, respectively (FIG. 4a).

When the sample 12 is subjected to a rotation by means of its susceptor 11, which rotates about an axis at right angles to its plane, the lack of thickness $-\Delta e$ is compensated for by the excess thickness $+\Delta e$ and the thickness of the layer growing on the sample is constant and equal to e.

Figure 5A:
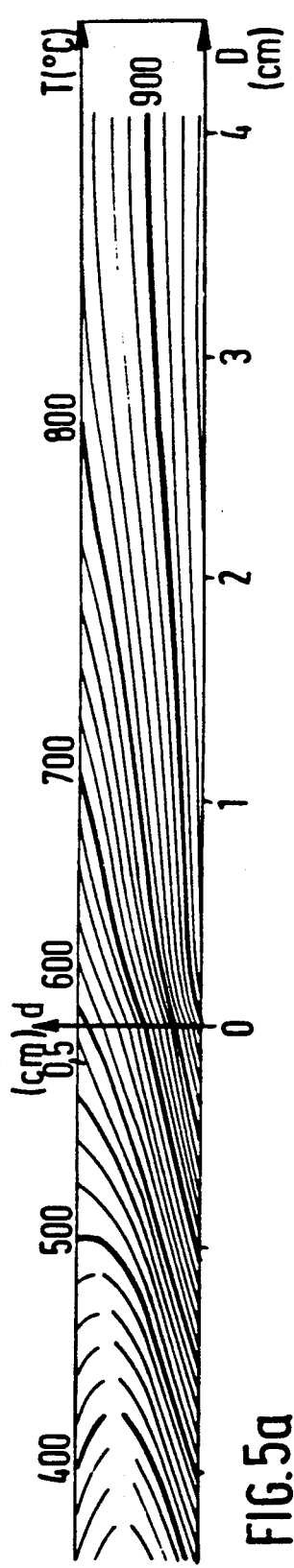
FIG. 5a show the isotherms as a function of the distance measured along the heated sample.
Figure 5B:
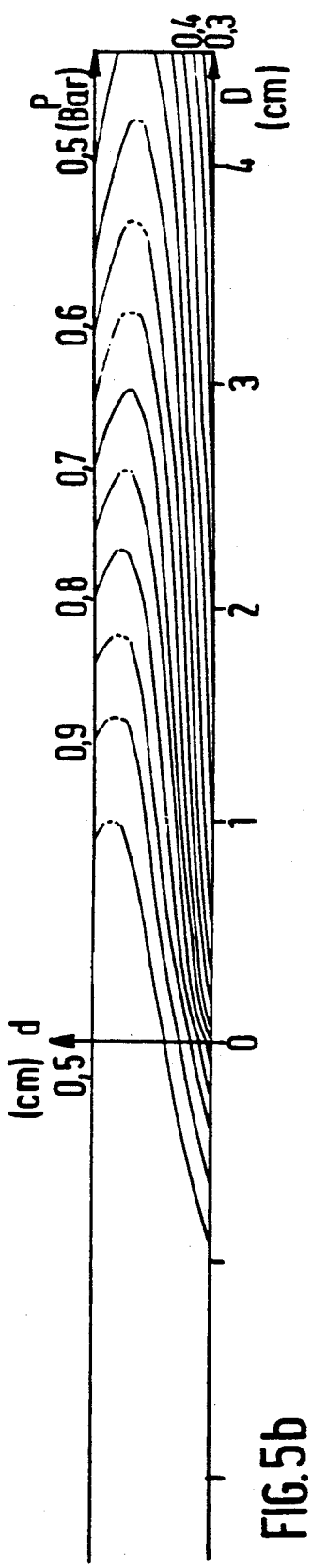
FIG. 5b show the isobars and FIG. 5c the profile of the rates of gas flow also as a function of the distance measured along the heated sample respectively.
Figure 5C:
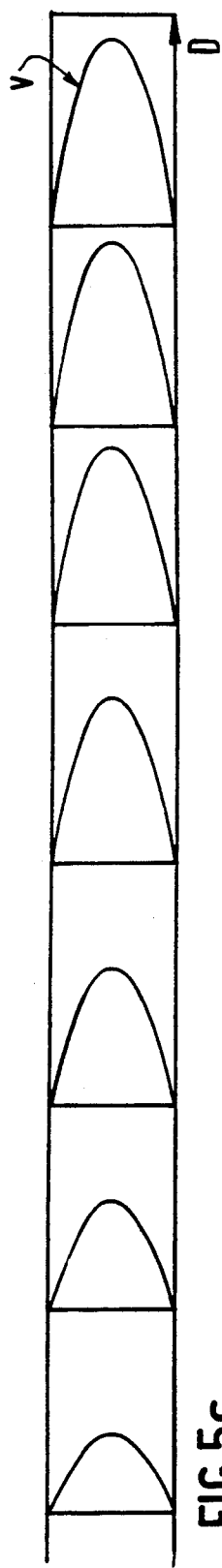

In an embodiment in which the distance d between the sample and the ceiling 20 is 0.5 cm, in which the temperature of deposition is T (°C.), in which the partial pressure of the organometallic compound is p in Bar and in which v is the rate of the gas in arbitrary units, FIGS. 5 show in the sectional view of FIG. 1 the survey of the isotherms (FIG. 5a), the isobars of partial pressure of organometallic compounds standardized on the input partial pressure (FIG. 5b) and the profile of the rate of the gas flow in arbitrary units (FIG. 5c). The distance D measured along the sample is indicated from the beginning 0 of the heated sample carrier. It should be noted that the profiles of the rated gas flow becomes very little different from a perfect parabola. The flow of gases is laminar.

In another embodiment, however, the flow of the gases could be turbulent and the invention would be perfectly applicable.

In a first variation of the invention, no attempt is made to obtain by regulation of the temperature of the ceiling a curve of decrease of the rate of growth which is linear and uniform, as shown in FIG. 2b.

Figure 6:
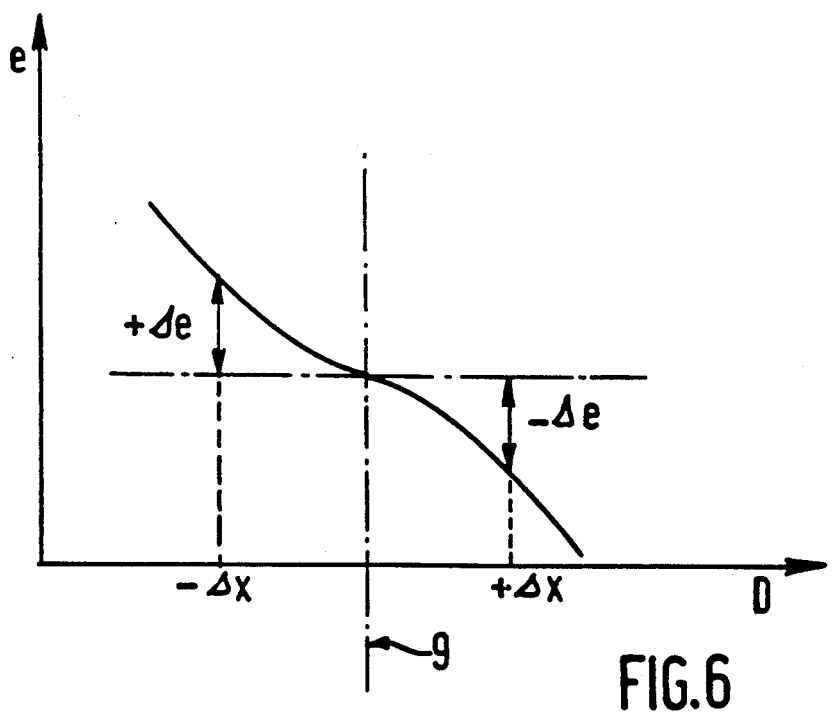
FIG. 6 shows a curve of an example in which the variation of the rate of growth measured along the sample is an anti-symmetrical function if the position of the axis of rotation is taken as the origin.

On the contrary, attempts are made to obtain a deviation of the rate of growth, which, with respect to the center of rotation is an anti-symmetrical function and whose origin is indicated with respect to the center of rotation. Such a function is indicated, for example, by the curve of FIG. 6. In the case, in which by heating of the ceiling, a rate of growth, such as indicated in FIG. 6, is obtained, the uniformity of the thickness of the layer can be obtained by rotation of the sample about an axis 9 arranged at 0.

In a second variation of the invention, is simply started from the recognition deduced from the curve of FIG. 2a that the layer deposited on the sample when the temperature of the ceiling is not regulated, has a concave thickness profile, whose concavity is turned towards the sample carrier in such a manner that the edges of the layer are thicker than the centre in the case of rotation of the sample.

By means of the regulation of the temperature of the ceiling of the chamber, attempts are made to attain the object of rendering the thickness profile of the layer convex in the lateral direction, i.e. at right angles to the direction of the flows of gas. This may be obtained, for example, by arranging heating resistors in the proximity of the ceiling of the chamber in the longitudinal direction in such a manner that the isotherms at the ceiling are then orientated parallel to the flow $\phi$.

When this new layer thickness profile is thus obtained, by rotation of the sample, the compensation of the thickness of the deposition and hence a uniform layer is obtained.

These different methods proposed have the advantage that the thermal profile of the ceiling can be adapted to the experimental conditions and to the nature of the material to be deposited.

In this manner, either layers of uniform thickness or layers of homogeneous composition or of homogeneous doping can be obtained without using different reactors, but by causing simply the electrical regulation of the heating of the ceiling of the chamber of the reactor to vary.

What is claimed is:

1. A method for depositing epitaxy layers of semiconductor materials from the vapor phase on a semiconductor substrate, said method comprising positioning said substrate on a susceptor located at the inner surface of a lower wall portion of a hollow horizontally elongated reactor comprising a horizontal wall portion, an upper wall portion and a lower wall portion opposite to said upper wall portion and two opposing open end portions, providing a flow of gaseous compounds, for forming said epitaxy layers on said substrate, through said reactor along an axis joining said open end portions at a temperature and pressure suitable for causing epitaxial growth of monocrystalline layers of said semiconductor material on said substrate while rotating said substrate about an axis intersecting said substrate and said upper and lower wall portions and while only heating said upper wall portion, in a non-uniform manner, so as to produce variations in the profile of the deposition of said epitaxial layer along an axis parallel to the direction of flow of said gaseous compounds in addition to those that would have been present in the absence of such heating and if such substrate was stationary.

2. A method as claimed in claim 1, characterized in that the temperature of the upper wall portion is regulated so as to obtain for the epitaxial layer, when the substrate is immovable, a profile of deposition which is convex in the direction at right angles to the flow of the gaseous compounds.

3. A method as claimed in claim 1 characterized in that the upper wall portion of the horizontally elongated reactor is heated by means of heating resistors and in that the regulation of the temperature of the upper wall portion is obtained by controlling the temperature of these resistors.

4. A method as claimed in claim 1 characterized in that the temperature of said upper wall portion is so regulated as to obtain a linear uniform decrease of the rate of growth of said epitaxy layers in a direction parallel to the direction of flow of the gaseous compounds parallel to the longitudinal axis of the horizontally elongated reactor when the substrate is immovable.

5. A method as claimed in claim 11 characterized in that the temperature of the upper wall portion is regulated so as to obtain, if the substrate was stationary, an epitaxial layer having a diametrically antisymmetrical layer thickness profile with respect to an axis intersecting the center of said substrate, said upper wall portion and said lower wall portion and extending along an axis intersecting said open end portions.

6. A method as claimed in claims 2, 4 or 5, characterized in that the substrate is subjected to a rotation about an axis at right angles to its plane at the center of antisymmetry of the profile of the epitaxial layer obtained in the absence of rotation, said antisymmetry being relative to the center of said substrate.

7. A method as claimed in claim 1 characterized in that it is used in the manufacture of epitaxial layers of materials of the III-V group on a substrate of a material of the group III-V employing organometallic compounds to obtain epitaxial layers having a uniform thickness.

8. A method as claimed in claim 1 characterized in that it is used in the manufacture of epitaxial layers of materials of the III-V group on a substrate of a material of the group III-V employing organometallic compounds to obtain epitaxial layers having a homogeneous properties.

* * * * *